United States Patent
Nakamikawa

(10) Patent No.: US 6,518,093 B1
(45) Date of Patent: Feb. 11, 2003

(54) SEMICONDUCTOR DEVICE AND METHOD FOR MANUFACTURING SAME

(75) Inventor: Takeshi Nakamikawa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/667,124

(22) Filed: Sep. 21, 2000

(30) Foreign Application Priority Data

Sep. 22, 1999 (JP) .......................................... 11-268472

(51) Int. Cl.[7] .............................................. H01L 21/44
(52) U.S. Cl. ........................ 438/108; 438/118; 438/127
(58) Field of Search ................................ 438/106–120, 438/121–127, 612–617, 977, FOR 343; 257/702–740, 776–796

(56) References Cited

U.S. PATENT DOCUMENTS

| | | | | |
|---|---|---|---|---|
| 5,912,505 A | * | 6/1999 | Itoh et al. ..................... | 257/737 |
| 6,040,630 A | * | 3/2000 | Panchou et al. ............. | 257/780 |
| 6,100,597 A | * | 8/2000 | Nakamura ................... | 257/737 |
| 6,103,551 A | * | 8/2000 | Ono et al. .................... | 438/108 |
| 6,117,759 A | * | 9/2000 | Greer et al. ............ | 228/180.22 |
| 6,132,646 A | * | 10/2000 | Zhou et al. ...................... | 148/24 |
| 6,189,208 B1 | * | 2/2001 | Estes et al. .................. | 174/260 |
| 6,229,220 B1 | * | 5/2001 | Saitoh et al. ................. | 257/738 |
| 6,245,595 B1 | * | 6/2001 | Nguyen et al. ......... | 228/180.22 |
| 6,348,399 B1 | * | 2/2002 | Lin .............................. | 438/108 |

* cited by examiner

*Primary Examiner*—Wael Fahmy
*Assistant Examiner*—Brook Kebede
(74) *Attorney, Agent, or Firm*—Hayes Soloway PC

(57) ABSTRACT

A method for manufacturing a semiconductor device including the steps of: forming a plurality of metallic connection members on at least one of a temporary substrate and a semiconductor chip; thrusting the temporary substrate and the semiconductor chip against each other; filling a space between the temporary substrate and the semiconductor chip with resin to embed therein the metallic connection members; curing the resin to form a first protective layer; and removing the temporary substrate from the first protective layer and the metallic connection members. In accordance with the semiconductor device manufactured by the method, the package of the semiconductor device can be miniaturized with the realization of the cost down by using no interposer, and the handling and the performance test are more conveniently conducted.

12 Claims, 11 Drawing Sheets

SEMICONDUCTOR DEVICE AND METHOD FOR MANUFACTURING SAME

BACKGROUND OF THE INVENTION (a) Field of the Invention

The present invention relates to a semiconductor device and a method for manufacturing the same, more in particular to the semiconductor device implementing the smaller package size and the method for manufacturing the same.

(b) Description of the Related Art

New packages for a semiconductor device have been developed one after another for responding to the demands of a higher degree of performance, miniaturization or operational speed. The planar miniaturization and the thinner structure of the semiconductor device are realized by higher integration of mounting semiconductor chips (sometimes referred to as "LSI chip"), thereby intending the still higher degree of the performance and the operational speed of an electronic device. In order to realize the higher degree of the performance of the LSI chips, a flip chip ball grid array (FCBGA) process has been developed.

A conventional semiconductor device including a package structure formed by the FCBGA process shown in FIG. 1 includes an LSI chip 11 having an interconnect pattern, a plurality of solder bumps 12 corresponding to the interconnect pattern, and a multi-layered interposer 24 having a plurality of electrode pads 33. The interposer has roles of elevating the handling performance of the semiconductor device, obtaining an arrangement of solder balls 25 corresponding to connection parts of a standardized substrate, and further protecting the surface of the LSI chip 11 from a probe during the performance test of the LSI chip 11.

A solder resist 34 is formed on the surface of the interposer 24 except for the electrode pads 33, and the solder balls are formed on the surface reverse to the electrode pads 34. Underfill resin 14 is filled in a gap among the LSI chip 11, the solder bumps 12 and the electrode pad 33 and cured while the solder bumps 12 and the electrodes pads 33 are electrically and mechanically connected.

For the manufacture of the conventional semiconductor device, at first the LSI chip 11 is aligned with the interposer 24, and the chip 11 and the interposer 24 are bonded to each other by means of re-flowing. After the washing depending on the necessity, the underfill resin 14 is further filled in the gap among the LSI chip 11, the solder bumps 12 and the electrode pad 33 and cured. Then, connection terminals such as the solder balls 25 are mounted on the reverse surface of the interposer 24 depending on the necessity.

The difficulty of peeling off the LSI chip 11 from the interposer 24 in the conventional semiconductor device forces the LSI chip judged to be inferior in the performance test to be scraped with the interposer 24. Accordingly, the interposer 24 must be manufactured at a cost as low as possible, and is manufactured by using an aligner without using an LSI stepper. Although the cost-down can be attained in the manufacturing method, the miniaturization becomes more difficult than the case where the LSI stepper is employed, thereby making the package itself large-scaled as well as the interposer 24 compared with the LSI chip 11.

A bare chip process may be used for miniaturization and/or simplification of the package. However, the LSI chip formed by the process is entirely thin and includes no protection layer, and the handling must be carefully conducted with burdensome operations. Further, the semiconductor devices manufactured by the bare chip process are likely subjected to damages such as a probing injury or scar generated during the test of the electrode pad. Accordingly, the performance test can not be easily conducted.

SUMMARY OF THE INVENTION

In view of the foregoing, an object of the present invention is to provide a semiconductor device in which a package is miniaturized without using an interposer and to which the handling and the performance test are easily conducted while realizing the cost down.

The present invention provides, in a first aspect thereof, a method for manufacturing a semiconductor device including the steps of: forming a plurality of metallic connection members on at least one of a temporary substrate and a semiconductor chip; thrusting the temporary substrate and the semiconductor chip against each other to press the metallic connection members therebetween; filling a space between the temporary substrate and the semiconductor chip with resin to embed therein the metallic connection members; curing the resin to form a first protective layer; and removing the temporary substrate from the first protective layer and the metallic connection members.

The present invention provides, in a second aspect thereof, a semiconductor device including: a semiconductor chip having thereon a plurality of chip electrodes, a plurality of metallic connection members in electric contact with the respective chip electrodes, a resin protective layer filling a space between the metallic connection members, said resin protective layer having a top surface exposing a top surface of each of the metallic connection members.

In accordance with the first and the second aspect of the present invention, the package of the semiconductor device can be miniaturized with the realization of the cost down by using no interposer, and the handling and the performance test are more conveniently conducted.

The above and other objects, features and advantages of the present invention will be more apparent from the following description.

PREFERRED EMBODIMENTS OF THE INVENTION

Now, the present invention is more specifically described with reference to accompanying drawings.

Embodiment 1

Figure 2A:
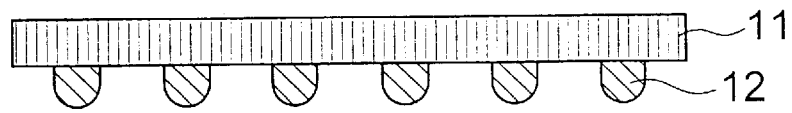
FIGS. 2A to 2F are longitudinal sectional views sequentially showing steps for manufacturing a semiconductor device in accordance with a first embodiment of the present invention.

At first, as shown in FIG. 2A, metallic bumps 12 made of solder including tin (Sn) and lead (Pb) are formed on a surface of an LSI chip 11 to which electrodes are connected. The metallic bump 12 may be used as an external connection terminal and the material is not restricted to the solder and another material such as gold (Au) can be used.

Figure 2B:
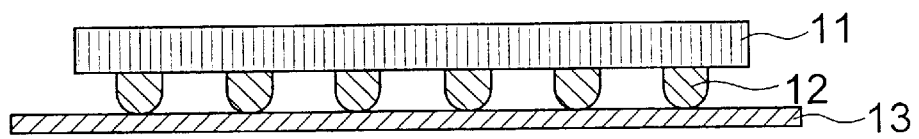

Then, the metallic bumps 12 are aligned to a temporary substrate 13 such that the LSI chip 11 is positioned with respect to the specified location of the temporary substrate 13 as shown in FIG. 2B. The temporary substrate 13 includes a plat surface having no unevenness and dimensions similar to those of the LSI chip 11. For example, the temporary substrate 13 can be fabricated by coating tetrafluoroethylene film on a metallic plate made by copper, stainless steel or aluminum or impregnating the metallic plate with the tetrafluoroethylene.

Figure 2C:
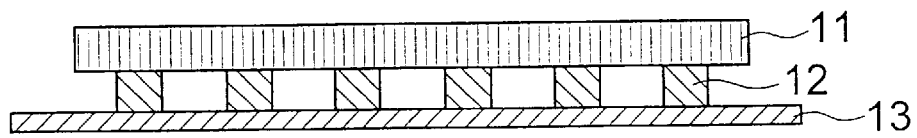

Then, as shown in FIG. 2C, a specified load is applied to the LSI chip 11 and the temporary substrate 13 to make a close contact between the metallic bumps 12 and the temporary substrate 13. When the number of the metallic bumps is 1,000, the LSI chip 11 and the temporary substrate 13 are preferably pressed to each other at a load between 10 and 50 kg at a temperature between 100 and 150° C. Flux may be applied onto the temporary substrate 13 or the metallic bump 12 for improving the joining ability of the solder.

The above relatively light pressing force reduces the burden to the LSI chip 11 and elevates the bonding strength between the LSI chip 11 and the temporary substrate 13, and the pressing conditions are not restricted thereto. A dig exclusively used for the close bonding can be utilized.

Figure 2D:
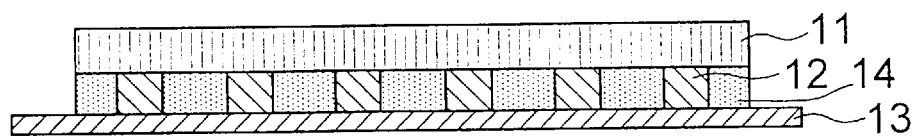

Then, as shown in FIG. 2D, underfill resin 14 is filled in a gap among the LSI chip 11, the solder bumps 12 and the temporary substrate 13 and cured under the specified conditions, thereby acting as a protective layer for protecting the LSI chip 11 and the metallic bumps 12. Following is an example of the above conditions. Epoxy-based paste for sealing a semiconductor containing a filler of which a main component is silicon dioxide is used as the underfill resin 14, and the underfill resin 14 is injected into the gap using a syringe, a needle and a dispenser followed by the curing at 150° C. for one hour.

Figure 2E:
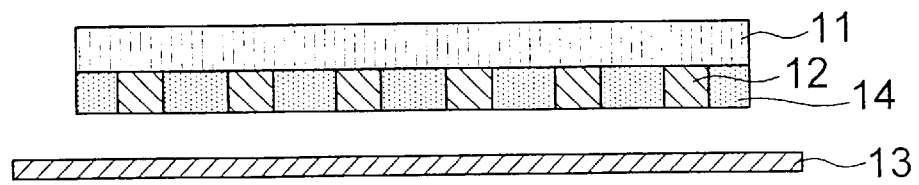
Figure 2F:
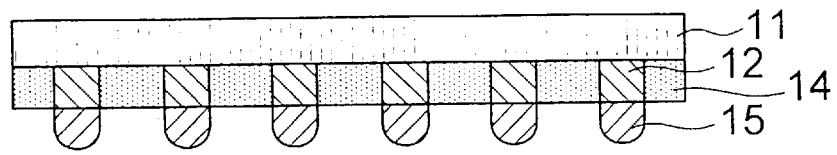

Then, as shown in FIG. 2E, the temporary substrate 13 in the state in FIG. 2D is peeled off from the metallic bumps 12 and the underfill resin 14. The surface coating of the temporary substrate 13 with the tetrafluoroethylene facilitates the peeling-off. Then, as shown in FIG. 2F, solder balls 15 for external connection are bonded to the respective metallic bumps 12 exposing to the surface including the underfill resin and the metallic bumps 12.

Since, in the first embodiment, the respective front portions of the cured metallic bumps are formed in a flat shape and not in a spherical shape by pressing the temporary substrate 13 onto the metallic bumps 12 at the specified pressure, the terminals having the flat front portions can be obtained after the temporary substrate 13 is peeled-off from the LSI chip 11 as shown in FIG. 2E.

Figure 3A:
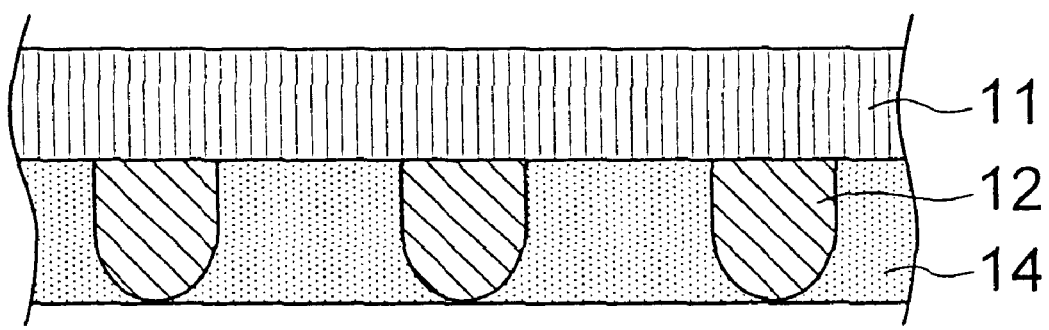
FIG. 3A is an enlarged longitudinal sectional view showing a conventional semiconductor device having solder bumps with a rounded front end before formation of solder balls for external connection, and FIG. 3B similarly shows a semiconductor device having solder bumps with a flattened front end in accordance with the first embodiment of the present invention.
Figure 3B:
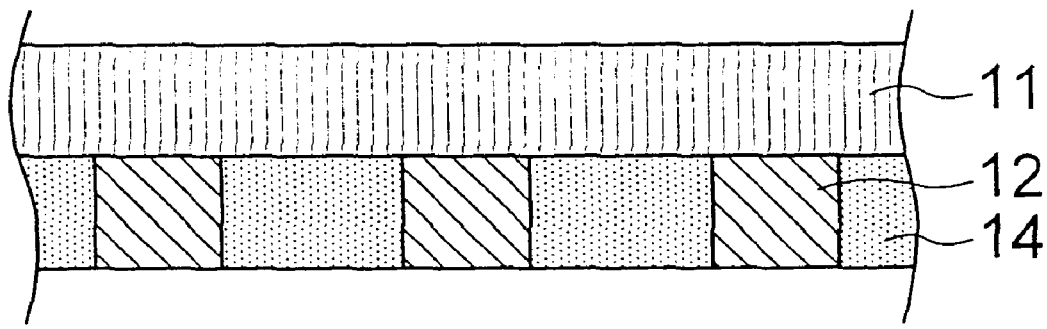

For example, when the metallic bump having the spherical front shape is used, the underfill resin 14 enters into the gap between the surface of the protection layer 14 and the spherical surface of the metallic bump 14 receding from the surface of the protection layer 14 to deteriorate the excellent contact and electro-conductivity as shown in FIG. 3A. Since, on the other hand, in the present embodiment, the metallic bump 12 having the flat front end which is exposed to the surface of the protection layer 14 is securely formed, the entering of the underfill resin 14 is prevented to provide the excellent contact and electro-conductivity, as shown in FIG. 3A.

Embodiment 2

Figure 4A:
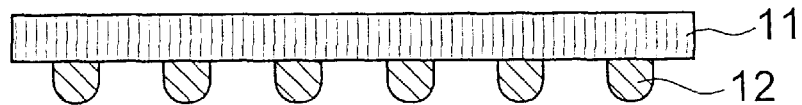
FIGS. 4A to 4F are longitudinal sectional views sequentially showing steps for manufacturing a semiconductor device in accordance with a second embodiment of the present invention.
Figure 4B:
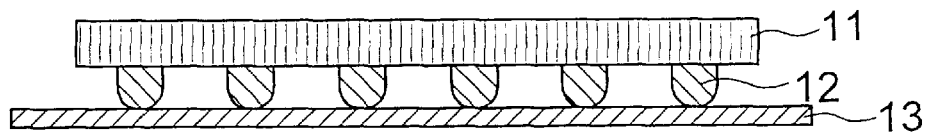

At first, as shown in FIG. 4A, metallic bumps 12 made of solder are formed on the surface of an LSI chip 11 to which electrodes are connected similarly to the first embodiment. As shown in FIG. 4B, the LSI chip 11 is disposed on a temporary substrate 13 made of copper (Cu) or aluminum (Al) and having a specified pattern such that the metallic bumps 12 are in precise consistence with a quasi pattern on the temporary substrate 13. Flux may be applied onto the temporary substrate 13 or the metallic bump 12 for improving the joining ability of the solder.

Figure 5:
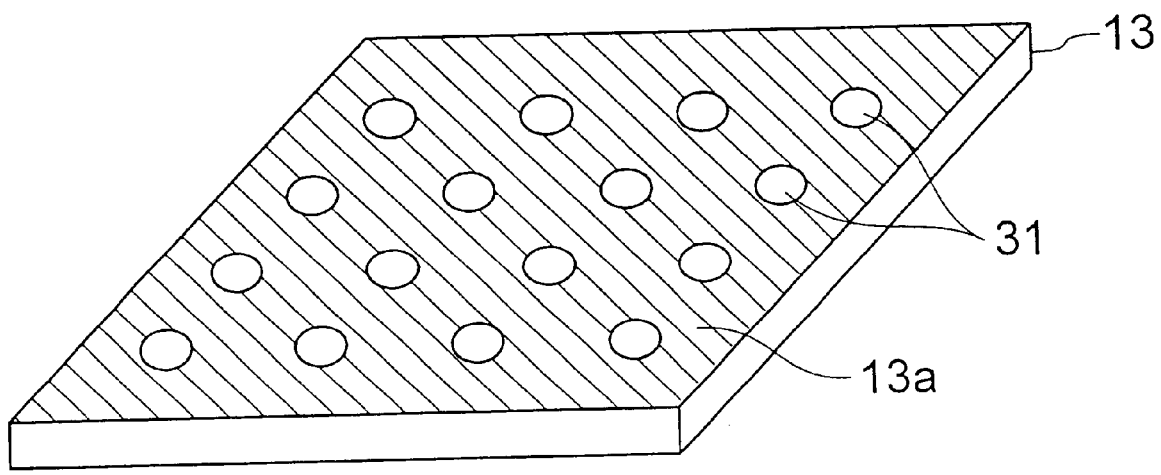
FIG. 5 is a perspective view showing the surface of a temporary substrate subjected to a treatment with black copper oxide.

When the temporary substrate 13 is made of the copper, a portion 13a of the luster substrate surface not in contact with the metallic bump 12 is treated with black copper oxide (blackening treatment) to form the quasi pattern 31 of the electrode pad as shown in FIG. 5. Thereby, the inconvenience of flowing melted solder into the periphery of the quasi pattern 31 can be prevented when the metallic bumps 12 are bonded to the temporary substrate 13 by re-flowing.

An aluminum substrate including a quasi pattern made of copper in contact with the metallic bumps or a stainless steel substrate including a quasi pattern made of copper, similar to that shown in FIG. 5, in contact with the metallic bumps may be used as the temporary substrate.

The quasi pattern may be a stacked structure including nickel and gold or including copper, nickel and gold other than the copper.

Figure 4C:
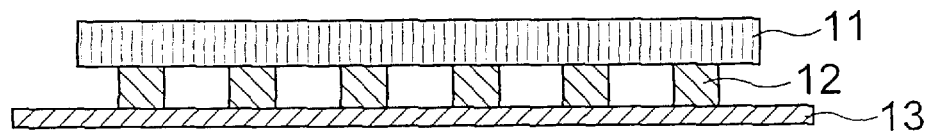

Then, as shown in FIG. 4C, the plurality of the metallic bumps 12 formed on the LSI chip 11 are re-flown to connect the LSI chip 11 and the temporary substrate 13 with each other. The LSI chip having the connection structure may be washed.

Figure 4D:
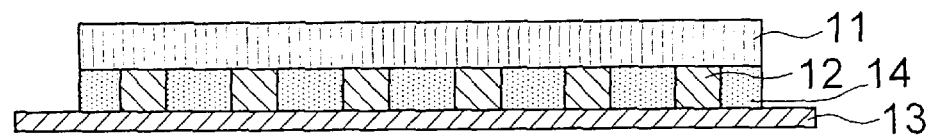

As shown in FIG. 4D, underfill resin 14 is injected into a gap among the LSI chip 11, the temporary substrate 13 and the metallic bumps 12 and cured under the specified conditions to form a protective layer. The condition may be the same as those of the first embodiment.

Figure 4E:

Then, as shown in FIG. 4E, the temporary substrate 13 in the state in FIG. 4D is removed from the metallic bumps 12 and the underfill resin 14 by using dry etching. An etchant containing ferric chloride may be used in the dry etching for the temporary substrate shown in FIG. 4D.

When the quasi pattern on the temporary substrate 13 is formed by the stacked structure including nickel and gold, the inconvenience that the solder portion of the metallic bump 12 is slightly etched to form a concave can be prevented.

Figure 4F:
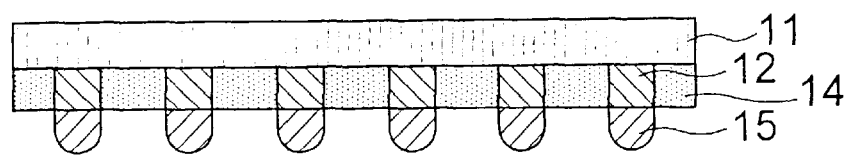

Then, as shown in FIG. 4F, solder balls 15 for external connection are bonded to the respective metallic bumps 12 exposing to the aligned surface including the underfill resin and the metallic bumps 12.

Since, in the second embodiment, the temporary substrate 13 adhering to the metallic bumps 12 and the underfill resin 14 is removed therefrom by the etching, the temporary substrate 13 is easily removed even when the temporary substrate 13 strongly adheres.

Although the semiconductor devices of the first and the second embodiments include only a single protective layer made of the underfill resin 14, the respective protective layers can be multi-layered by repeating the steps shown in FIGS. 2A to 2F or in FIGS. 4A to 4F. For obtaining the multi-layers, after the formation of the single protective layer, another protective layer is formed thereon and the corresponding metallic bumps are connected with each other. The repetition of the steps provides the multi-layered protective layer.

When an interconnect substrate is mounted on a package (semiconductor device) by melting solder balls between the substrate and the package accommodated in a re-flowing apparatus, a deforming stress due to a difference between the thermal expansibilities of the substrate and the package generated by the applied heat and the subsequent heat-applying process may be applied to the solder balls 15. When the stress is extremely larger, cracks may be produced. However, the deforming stress can be diminished or reduced by using the multi-layered protective layers and appropriately adjusting the gap between the package and the interconnect substrate.

Embodiment 3

Figure 6A:
FIGS. 6A to 6F are longitudinal sectional views sequentially showing steps for manufacturing a semiconductor device in accordance with a third embodiment of the present invention.
Figure 6B:
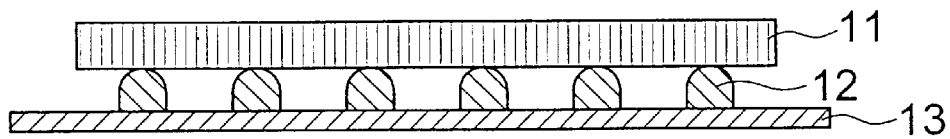

At first, an LSI chip 11 shown in FIG. 6A is disposed in precise consistence with metallic bumps 12 mounted on a quasi pattern, corresponding to respective electrodes, of a temporary substrate 13 as shown in FIG. 6B. Flux may be applied onto the temporary substrate 13 or the LSI chip 11 for improving the joining ability of the solder.

The metallic bumps may be made of solder, or may. be a stacked structure including solder and copper or solder, gold and nickel. The temporary substrate 13 may be a stainless steel substrate, an aluminum substrate or a copper substrate to which, except for the quasi pattern, a blackening treatment is conducted.

Figure 6C:
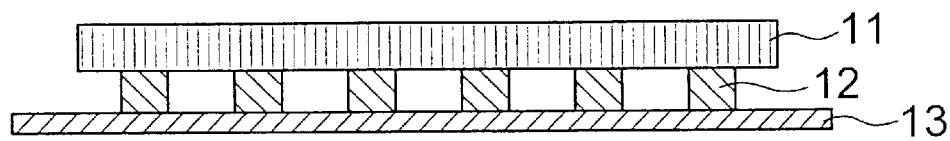

Then, as shown in FIG. 6C, the plurality of the metallic bumps 12 formed on the temporary substrate 13 are re-flown to connect the LSI chip 11 and the temporary substrate 13 with each other. The LSI chip having the connection structure may be washed.

Figure 6D:
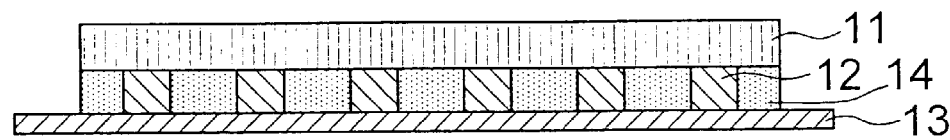

Then, as shown in FIG. 6D, underfill resin 14 is injected into a gap among the LSI chip 11, the temporary substrate 13 and the metallic bumps 12 and cured under the specified conditions to form a protective layer. The condition may be the same as those of the first embodiment.

Figure 6E:

Then, as shown in FIG. 6E, the temporary substrate 13 in the, state of FIG. 6D is removed from the metallic bumps 12 and the underfill resin 14 by using wet etching. An etchant containing ferric chloride may be used in the wet etching for easily removing the temporary substrate 13 such as the stainless steel substrate.

When the quasi pattern on the temporary substrate 13 is formed by the stacked structure including nickel and gold, the inconvenience that the solder portion of the metallic bump 12 is slightly etched to form a concave can be prevented.

Figure 6F:
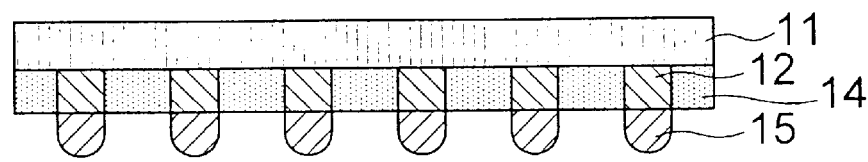

Then, as shown in FIG. 6F, solder balls 15 for external connection are bonded to the respective metallic bumps 12 exposing to the aligned surface including the underfill resin 14and the metallic bumps 12.

In the second and the third embodiments, the respective front portions of the cured metallic bumps are formed in a flat shape and not in a spherical shape by the re-flow of the metallic bumps, Accordingly, the terminals having the flat front portions exposing to the surface of the protective layer can be obtained when the temporary substrate 13 is removed from the LSI chip 11 as shown in FIGS. 4E and 6E. Thereby, similarly to the first embodiment, the entering of the underfill resin 14 is prevented to provide the excellent contact and electro-conductivity.

In each of the first to third embodiments, an interposing function of obtaining the arrangement of the solder balls 15 corresponding to the standardized interconnect pattern of a circuit substrate possessed by the conventional interposer 24 (FIG. 1) belongs to the connection side of the LSI chip 1 or the circuit substrate.

Embodiment 4

Figure 7A:
FIGS. 7A to 7E are longitudinal sectional views sequentially showing steps for manufacturing a semiconductor device in accordance with a fourth embodiment of the present invention.
Figure 7B:
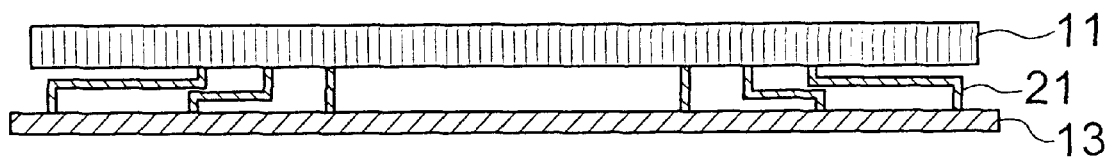

At first, an LSI chip 11 shown in FIG. 7A is disposed in precise consistence with a temporary substrate 13 including a plurality of lead wires 21 having one end fixed thereon along a quasi pattern, and is connected to the temporary substrate 13 by re-flowing the other end of the lead wires 21, as shown in FIG. 7B. The LSI chip having the connection structure may be washed.

The temporary substrate 13 is made of stainless steel, aluminum or copper. The lead wires are formed on the surface of the temporary substrate 13 opposing to the LSI chip by means of molding.

The respective lead wires 21 include the portions made of solder connected to the LSI chip 11 and the temporary substrate 13, and the other portions made of another metal. In place thereof, a lead wire entirely made of stainless steel, copper or solder can be used. If the solder formulation of the portion of the solder lead wire connected to the LSI chip 11 is modified to have a lower melting point, the connection step is conveniently conducted. Flux may be applied onto the temporary substrate 13 or the LSI chip 11 for improving the joining. ability of the solder. The lead wire is relatively rigid, however, in place of the rigid lead wire, a softer wire made of solder or gold may be used as the lead wire.

Figure 7C:
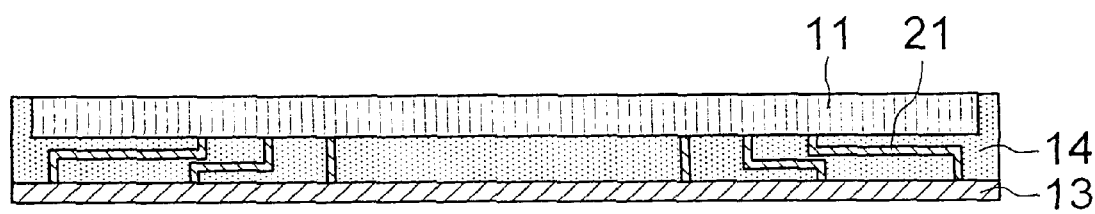

Then, as shown in FIG. 7C, underfill resin 14 is injected into a gap among the LSI chip 11, the temporary substrate 13 and the lead wires 21 and cured under the specified conditions to form a protective layer. The condition may be the same as those of the first embodiment.

Figure 7D:
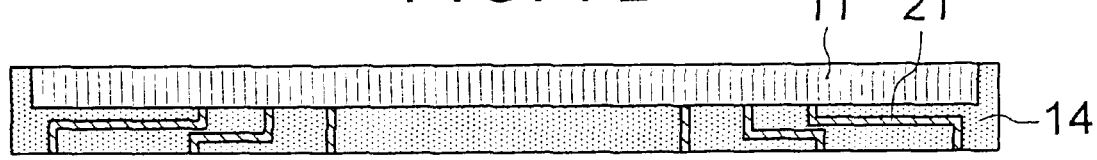

Then, as shown in FIG. 7D, the temporary substrate 13 in the state of FIG. 7C is removed from the lead wires 21 and the underfill resin 14 by using wet etching. An etchant containing ferric chloride may be used in the above wet etching.

Figure 7E:
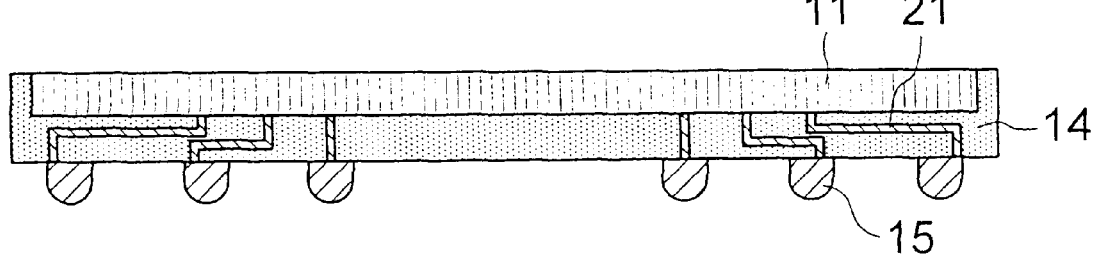

Then, as shown in FIG. 7E, solder balls 15 for external connection are bonded to the respective lead wires 21 exposing to the aligned surface including the underfill resin 14 and the lead wires 21.

An example of forming the lead wire 21 will be described.

Figure 8:
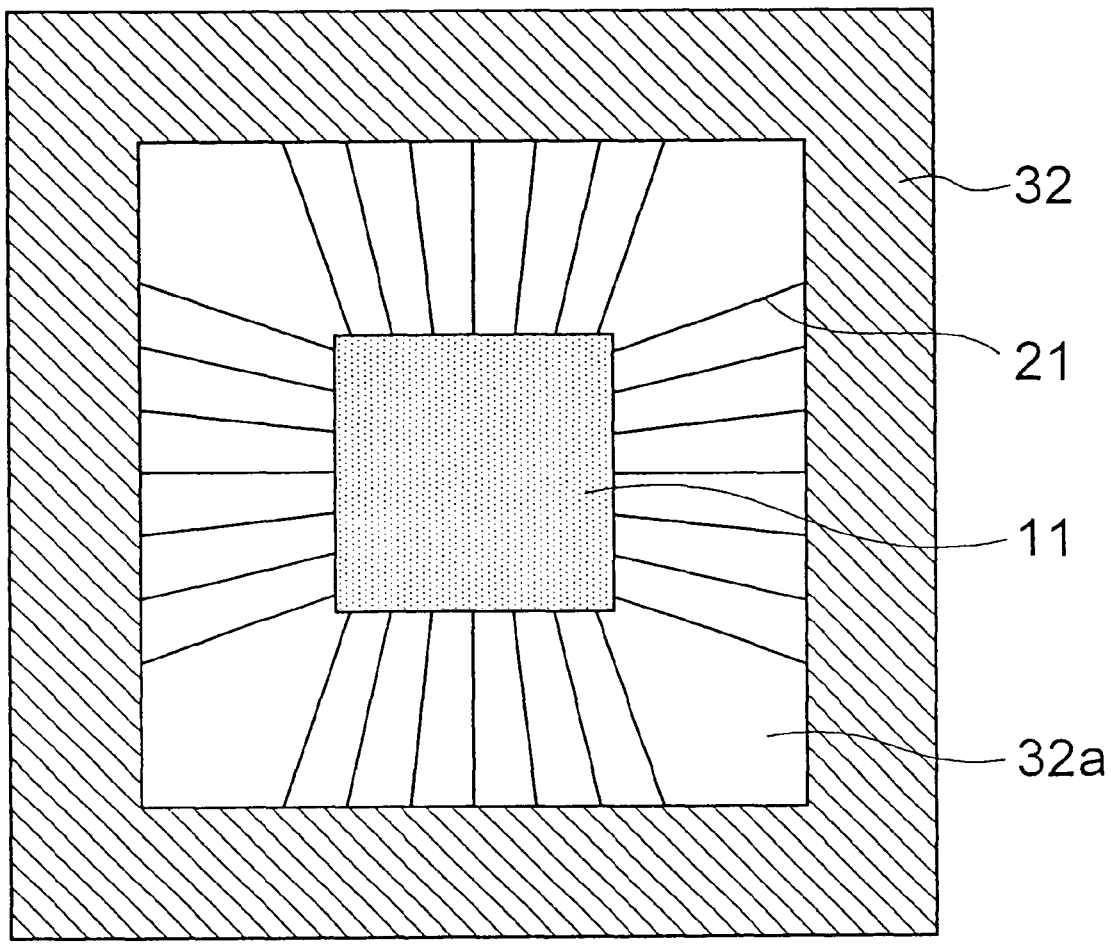
FIG. 8 is a top plan view showing an LSI chip having lead wires connected thereto.

In FIG. 8 showing a structure in which the lead wires 21 are formed on the LSI chip 11 side different from the structure shown in FIG. 7B, a plurality of the lead wires 21 extend from all the sides toward the center of an opening 32a of a rectangular frame 32. The LSI chip 11 is electrically and mechanically bonded to the respective front ends of the lead wires 21.

Figure 9A:
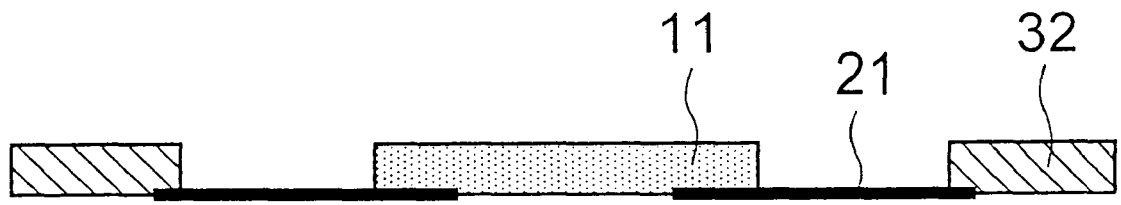
FIGS. 9A to 9C are longitudinal sectional views sequentially showing steps for manufacturing an LSI chip having processed lead wires connected thereto.
Figure 9B:
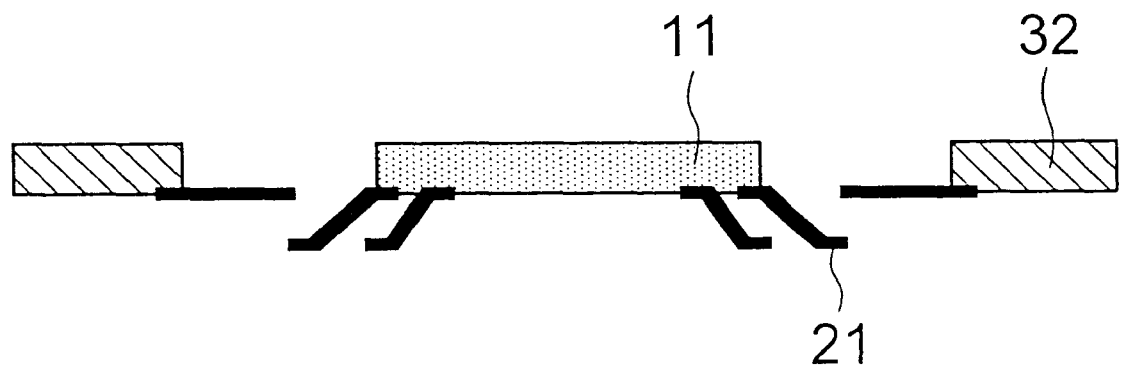
Figure 9C:
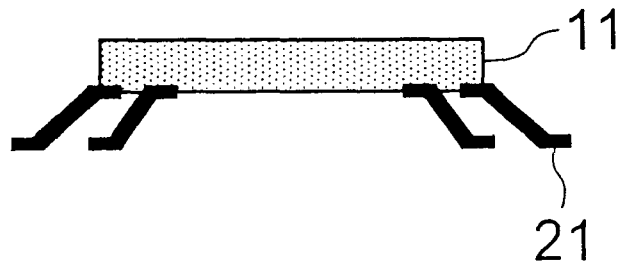

In FIG. 9A, one ends of a plurality of the lead wires 21 are located under the periphery of the LSI chip 11 and the other ends thereof are located along the bottom periphery of the opening of the frame 32. Then, as shown in FIG. 8B, the respective lead wires 21 are cut by using the molding having the specified structure. Then, as shown in FIG. 9C, the lead wires 21 are bent to the specified shape to provide the LSI chip 11 having the plurality of the lead wires 21.

Since the lead wires 21 of which an interconnect pattern may be modified are present in the protective layer in the fourth embodiment, the inter connect pitch and the arrangement thereof can be modified depending on the interconnect pattern of an interconnect substrate to which the lead wires are mounted by changing the state of the lead wires 21 exposed to the protective layer.

Embodiment 5

Figure 10A:
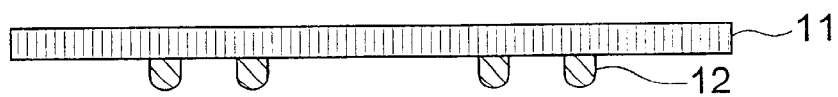
FIGS. 10A to 10G are longitudinal sectional views sequentially showing steps for manufacturing a semiconductor device in accordance with a fifth embodiment of the present invention.
Figure 10B:
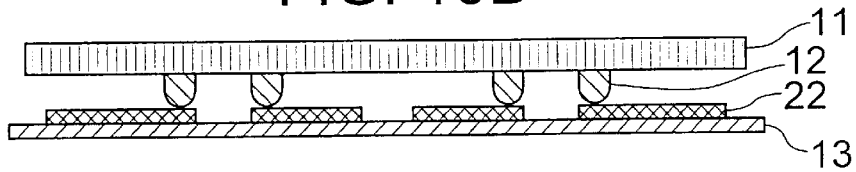

An LSI chip 11 shown in FIG. 10A includes, on an electrode-forming surface, a plurality of metallic bumps 12 to which gold-plating is conducted. The LSI chip having this structure is disposed in precise consistence with a temporary substrate 13 having a convex pattern 22 as shown in FIG. 10B.

The convex pattern 22 is formed on the temporary substrate 13 by coating photosensitive resist on a substrate made of stainless steel, aluminum or copper, photolithographically forming an interconnect pattern, and plating the interconnect pattern with gold or with a stacked structure including copper and gold.

The formation of the convex pattern 22 can be performed by using the technique other than the above, for example, by using an active method, an etching method employing a photolithographic technique for a clad material and a press-processing method.

Figure 10C:
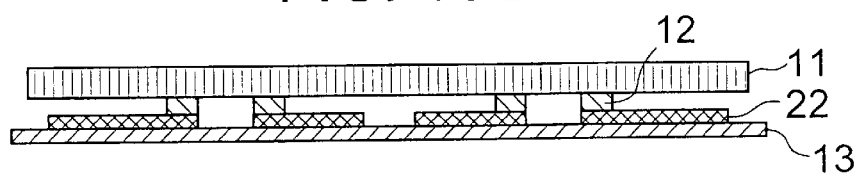

Then, as shown in FIG. 10C, after the metallic bumps 12 on the LSI chip are disposed in precise consistence with the convex pattern 22 of the temporary substrate 13, the gold on the surface of the metallic bumps 12 and the gold of the convex pattern are bonded with each other under pressure while pressing the LSI chip 11 and the temporary substrate 13 to each other, thereby connecting the metallic bumps 12 to the corresponding patterns 22.

Figure 10D:
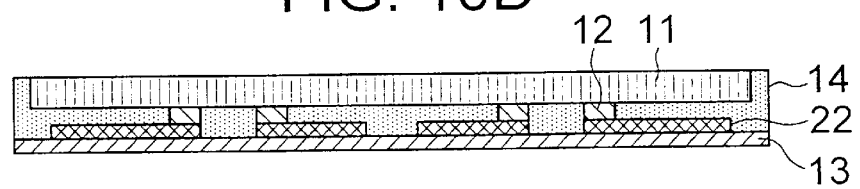

Then, as shown in FIG. 10D, underfill resin 14 is injected into a gap among the LSI chip 11, the temporary substrate 13 and the metallic bumps 12 and cured under the specified conditions to form a protective layer. The conditions may be the same as those of the first embodiment.

Figure 10E:
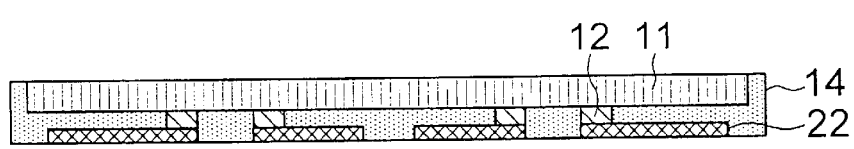

Then, as shown in FIG. 10E, the temporary substrate 13 is removed from the convex pattern 22 and the underfill resin 14 by using wet etching. In this manner, the convex pattern 22 covered with the temporary substrate 13 in FIG. 10D is exposed to be converted into a terminal of a metallic pattern 22. The temporary substrate 13 having the above configuration can be removed by an etchant containing ferric chloride.

Figure 10F:
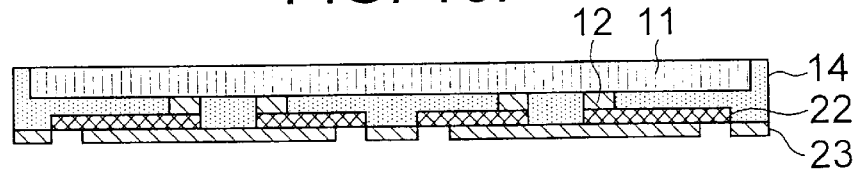

Then, as shown in FIG. 10F, solder resist 23 is applied on a portion other than the pad portion for external connection by using a printing method and cured under the specified conditions to form a protective layer for the terminal of the metallic pattern 22.

Figure 10G:
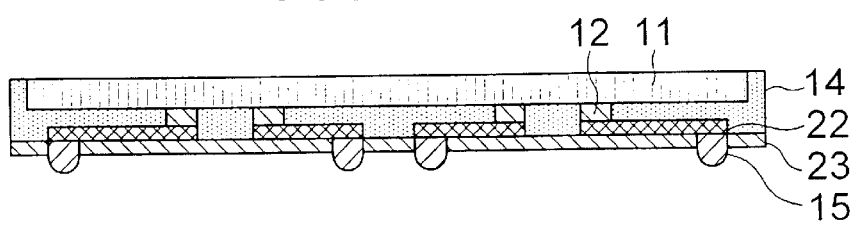

Then, as shown in FIG. 10G, solder balls 15 for external connection are bonded to the pad portions of each of the terminal of the metallic pattern 22.

Embodiment 6

Figure 11A:
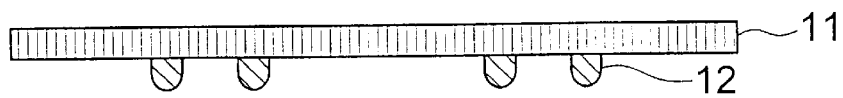
FIGS. 11A to 11G are longitudinal sectional views sequentially showing steps for manufacturing a semiconductor device in accordance with a sixth embodiment of the present invention.
Figure 11B:
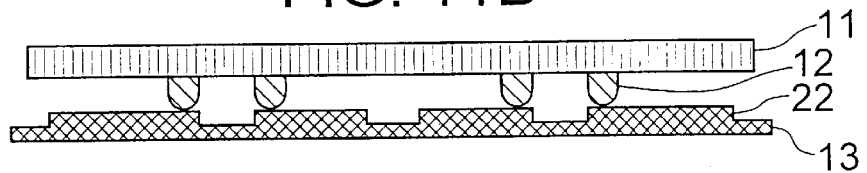

An LSI chip 11 shown in FIG. 11A includes, on an electrode-forming surface, a plurality of metallic bumps 12 to which gold-plating is conducted. The LSI chip having this structure is disposed in precise consistence with a temporary substrate 13 having a convex pattern 22 as shown in FIG. 11B.

The convex pattern 22 is formed on the temporary substrate 13 by coating photosensitive resist on a substrate made of stainless steel, aluminum or copper, photolithographically forming an interconnect pattern, and plating the interconnect pattern with gold. After the peeling-off of the photosensitive resist, the temporary substrate 13 is subjected to half-etching by using the plated gold as a mask. The convex pattern 22 of the temporary substrate 13 is not restricted to the above, and an active method or the like can be used similarly to the fifth embodiment.

Figure 11C:
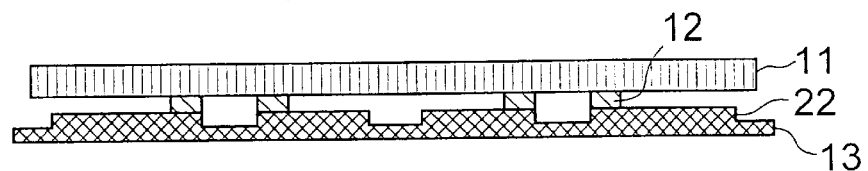

Then, as shown in FIG. 11C, after the metallic bumps 12 on the LSI chip are disposed in precise consistence with the convex pattern 22 of the temporary substrate 13, the gold-gold bonding is conducted under pressure while pressing the LSI chip 11 and the temporary substrate 13 to each other, thereby connecting the metallic bumps 12 to the corresponding patterns 22.

Figure 11D:
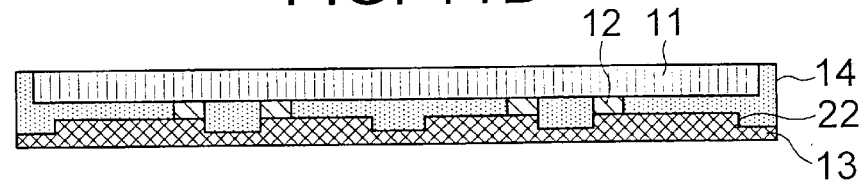

Then, as shown in FIG. 11D, underfill resin 14 is injected into a gap among the LSI chip 11, the temporary substrate 13 and the metallic bumps 12 and cured under the specified conditions to form a protective layer. The conditions may be the same as those of the first embodiment.

Figure 11E:
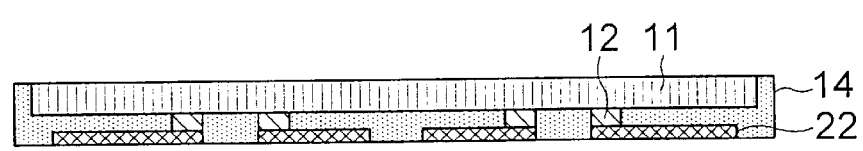

Then, as shown in FIG. 11E, the temporary substrate 13 is removed leaving the convex pattern 22 on the underfill resin 14 side by using wet etching. In this manner, the convex pattern 22 which has been covered with the temporary substrate 13 in FIG. 11D is exposed to be converted into a terminal of a metallic pattern 22. The temporary substrate 13 having the above configuration can be removed by an etchant containing ferric chloride. Since the temporary substrate is formed by a single metal plate having the convex pattern 22, the metal plate after the etching can be used as an interconnect without further processing.

Figure 11F:
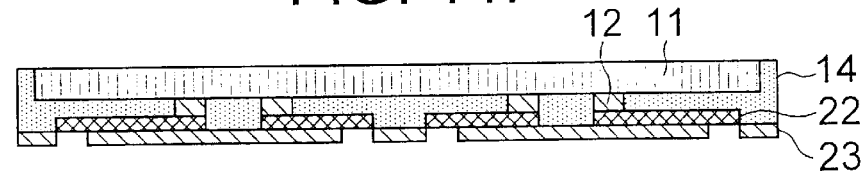

Then, as shown in FIG. 11F, solder resist 23 is applied on a portion other than the pad portion for external connection by using a printing method and cured under the specified conditions to form a protective layer for the connection pattern 22.

Figure 11G:
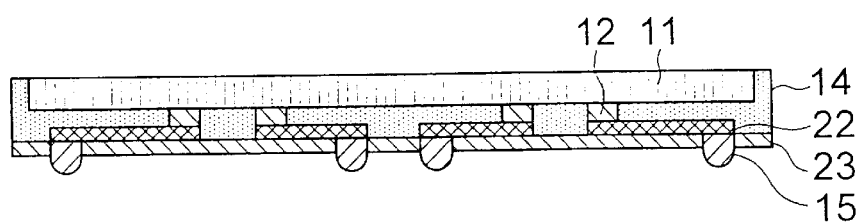

Then, as shown in FIG. 11G, solder balls 15 for external connection are bonded to the pad portions of each of the terminals of the metallic pattern 22.

Since the surface of the LSI chip 11 in the semiconductor device is covered with the protective layer (cured solder resist) 23 in addition to the protective layer 14 made of the resin in the fifth and sixth embodiments, the handling and the performance test are more conveniently conducted. Since the terminal of the metallic pattern 22 of which an interconnect pattern may be modified is present in the protective layer, the interconnect pitch and the arrangement thereof can be modified depending on the interconnect pattern of an interconnect substrate by changing the state of the terminal of the metallic pattern exposed to the protective layer.

Since, in each of the fourth to sixth embodiments, an interposing function is included in the protective layer 14 or 23, it is unnecessary for the LSI chip 11 side and the connection portion side of the circuit substrate to have the interposing function different from the first to third embodiments. Accordingly, the design of the conventional LSI chip and the conventional circuit substrate can be used without further processing.

Since, in the first to sixth embodiments, the package is fabricated by fixing the LSI chip 11 to the temporary substrate 13, injecting and curing the underfill resin 14, and peeling-off or removing at least part of the temporary substrate 13, the package size is reduced to that of the LSI chip 11 without requiring the conventional interposer 24

(FIG. 1) to miniaturize the semiconductor device. The simplified structure thus obtained realizes the higher productivity and the lower cost package.

Since, further in the first to sixth embodiments, the protective layer 14 having substantially the same height as that of the top end of the metallic bump 12 formed on the electrode pad of the LSI chip 11 covers the periphery of each of the metallic bumps 12 and protects the surface of the LSI chip 11, the original electrode pad of the LSI pad in the probing to the metal pad 12 can be protected from damages or scars which may be generated during the performance test. Further, the handling and the performance test are conveniently conducted because the LSI chip 11 is protected by the underfill resin 14.

In the first to sixth embodiments, the underfill resin 14 itself and the method for injecting the underfill resin 14 are not restricted to those already described. For example, a variety of resin including epoxy-phenol-based resin, phenol-based resin, acryl-based resin and silicon-based resin can be used as the underfill resin 14. Depending on the kind of the underfill resin employed, the injection method may be selected from a potting method, a transfer-molding method and a printing method. The curing of the underfill resin may be conducted depending on the kind and the characteristics of the resin employed and is not restricted to the method and the conditions already described.

In the potting method, the underfill resin is flown into the periphery of the LSI chip by using a syringe-like injector, and the resin is allowed to enter into the gap between the LSI chip and the temporary substrate. In the transfer-molding method, the LSI chip 11 and the temporary substrate 13, for example, shown in FIG. 7B are sandwiched by a pair of molds, and the underfill resin 14 is compulsorily injected into the molds, thereby improving the molding shape. In the printing method similarly to the potting method, the underfill resin 14 is added dropwise to the periphery of the LSI chip 11 and is allowed to enter into the gap. In this case, the underfill resin 14 is excellently injected into a narrow space.

When the temporary substrate is a film, the required strength for smoothly peeling off the temporary substrate from the underfill resin cannot be obtained. In the first to sixth embodiments, however, the temporary substrate 13 made by the metal plate provides the following advantages (1) to (3).

(1) The temporary substrate 13 having the required strength by itself facilitates the peeling-off of the temporary substrate 13 from the solder bumps 12 and the protective layer 14.

(2) Since no organic components are left on the solder bump surface after the peeling-off of the temporary substrate 13, the excellent electric conductivity and contacting ability are not deteriorated.

(3) Since the temporary substrate 13 has the planarity with the specified strength, the top ends of the solder bumps 12 and the surface of the protective layer 14 form a single plane during the re-flow of the solder bumps 12 at a specified pressure.

Figure 1:
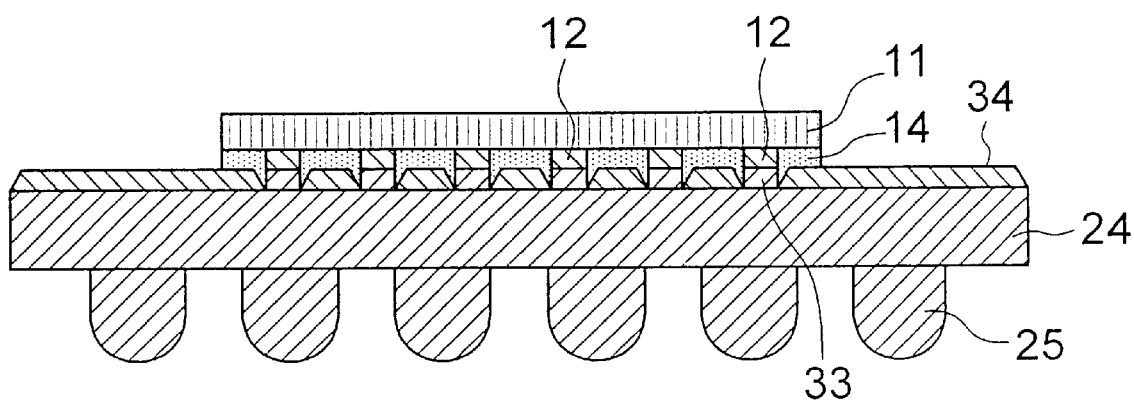
FIG. 1 is a longitudinal sectional view showing a conventional semiconductor device including an FCBGA package structure.

In connection with the advantage (3), since the interposer 24 and the solder bumps 12 are adhered to each other with higher strength for elevating the reliability in the conventional semiconductor device shown in FIG. 1, the surface after the peeling-off is uneven so that the top ends of the solder bumps 12 and the surface of the protective layer 14 cannot provide a single plane different from the embodiments of the present invention, even when the interposer 24 is peeled-off from the LSI chip 11. When a film-like member is used in place of the temporary substrate 13, the elasticity of the film-like member cannot provide the single plane formed by the solder bumps 12 and the protective layer 14.

The temporary substrate of the present invention is not restricted to those described in the first to sixth embodiments, and any configuration for easily conducting the solder connecting step and the temporary substrate-removing step can be employed. The formation of the solder balls 15 for the external connection in the final step in each of the embodiments is not essential, and the material and the values in the embodiments are not restricted thereto.

Although the member formed by bonding the protective layer 14 and the solder bumps 12 to the LSI chip 11 is referred to as the package in the first to sixth embodiments, the package employable in the present invention is not restricted thereto, and, for example, an LSI chip 11 having a heat splitter (heat sink) on its bottom surface (the top surface in FIG. 2A, for instance) is also called the package.

Since the above embodiments are described only for examples, the present invention is not limited to the above embodiments and various modifications or alternations can be easily made therefrom by those skilled in the art without departing from the scope of the present invention.

What is claimed is:

1. A method for manufacturing a semiconductor device comprising the steps of:

forming a plurality of metallic connection members on at least one of a temporary substrate and a semiconductor chip;

thrusting the temporary substrate and the semiconductor chip against each other to press the metallic connection members therebetween;

filling a space between the temporary substrate and the semiconductor chip with resin to embed therein the metallic connection members;

curing the resin to form a first protective layer; and removing the temporary substrate from the first protective layer and the metallic connection members.

2. The method as defined in claim 1, wherein the thrusting step includes heating each of the metallic connection members to have a substantially flat surface in contact with the temporary substrate.

3. The method as defined in claim 1, wherein the metallic connection members are metallic bumps formed on respective chip electrodes formed on the semiconductor chip.

4. The method as defined in claim 1, wherein the metallic connection members are wires.

5. The method as defined in claim 1, wherein each of the metallic connection members includes a metallic bump formed on a corresponding one of chip electrodes, and a terminal of a metallic pattern formed on the temporary substrate.

6. The method as defined in claim 5, wherein the terminal of the metallic pattern is made of a material the same as or different from that of the temporary substrate.

7. The method as defined in claim 5, wherein the terminal of the metallic pattern is formed by means of plating, etching or pressing.

8. The method as defined in claim 5 further comprising the step of forming a second protective layer for protecting the terminal of the metallic pattern exposing from the first protective layer after the temporary substrate removing step.

9. The method as defined in claim 1 further comprising the step of forming solder balls on a portion of the metallic connection member exposed from the first protective layer after the temporary substrate removing step.

10. The method as defined in claim 1, wherein the temporary substrate is removed from the first protective layer and the metallic connection member by means of mechanical peeling-off or etching in the temporary substrate removing step.

11. The method as defined in claim 1, wherein the temporary substrate is a plate surface-treated with tetrafluoroethylene coating or tetrafluoroethylene impregnation.

12. The method as defined in claim 1, wherein the temporary substrate is a metallic plate.

* * * * *